United States Patent
Layer et al.

(10) Patent No.: US 11,054,458 B2
(45) Date of Patent: Jul. 6, 2021

(54) METHOD AND DEVICE FOR DETECTING FAULTS IN A TRANSMISSION LINE

(71) Applicant: COMMISSARIAT A L'ENERGIE ATOMIQUE ET AUX ENERGIES ALTERNATIVES, Paris (FR)

(72) Inventors: Christophe Layer, Paris (FR); Esteban Cabanillas, Orsay (FR); Antoine Dupret, Orsay (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 100 days.

(21) Appl. No.: 16/620,853

(22) PCT Filed: Jun. 1, 2018

(86) PCT No.: PCT/EP2018/064414
§ 371 (c)(1),
(2) Date: Dec. 9, 2019

(87) PCT Pub. No.: WO2018/228826
PCT Pub. Date: Dec. 20, 2018

(65) Prior Publication Data
US 2020/0200814 A1    Jun. 25, 2020

(30) Foreign Application Priority Data
Jun. 16, 2017 (FR) ........................................ 1755478

(51) Int. Cl.
*G01R 31/08* (2020.01)
*G01R 31/11* (2006.01)

(52) U.S. Cl.
CPC .................................... *G01R 31/11* (2013.01)

(58) Field of Classification Search
CPC .... G01R 31/08; G01R 31/085; G01R 31/086; G01R 31/11; G01R 31/50; G01R 29/085
See application file for complete search history.

(56) References Cited

U.S. PATENT DOCUMENTS

| 5,521,512 A | 5/1996 | Hulina |
| 6,104,197 A * | 8/2000 | Kochan ................ G01R 31/11 324/533 |

(Continued)

FOREIGN PATENT DOCUMENTS

| EP | 0 675 607 A2 | 10/1995 |
| FR | 2 332 741 A1 | 6/1977 |
| FR | 2 926 141 A1 | 7/2009 |

*Primary Examiner* — Son T Le
(74) *Attorney, Agent, or Firm* — BakerHostetler

(57) ABSTRACT

A method and device for detecting faults in a transmission line by reflectometry, include the following steps: injecting into the transmission line a reference signal at an emission frequency $f_{DAC}$; collecting a reflected signal at a point on the transmission line; sampling the reflected signal at a sampling frequency $f_{ADC}$, the sampling frequency $f_{ADC}$ being different from the emission frequency $f_{DAC}$; storing each point of the sampled signal at a memory address corresponding to an index assigned to the point of the sampled signal and according to a precomputed memory-address increment $\Delta$, the memory-address increment $\Delta$ depending on the emission frequency $f_{DAC}$, on the sampling frequency $f_{ADC}$, on an over-sampling factor $\Omega$ and on a preset acquisition time $\Sigma$; repeating the storing step during the acquisition time $\Sigma$; and generating, from the points stored during the acquisition time, a recomposed signal able to be used to detect faults.

12 Claims, 7 Drawing Sheets

(56) References Cited

U.S. PATENT DOCUMENTS

| | | | |
|---|---|---|---|
| 7,679,371 B1 | 3/2010 | Lo | |
| 2009/0315565 A1* | 12/2009 | Wyar | G01R 31/11 |
| | | | 324/533 |
| 2016/0139194 A1* | 5/2016 | Cohen | G01R 31/11 |
| | | | 324/533 |

* cited by examiner

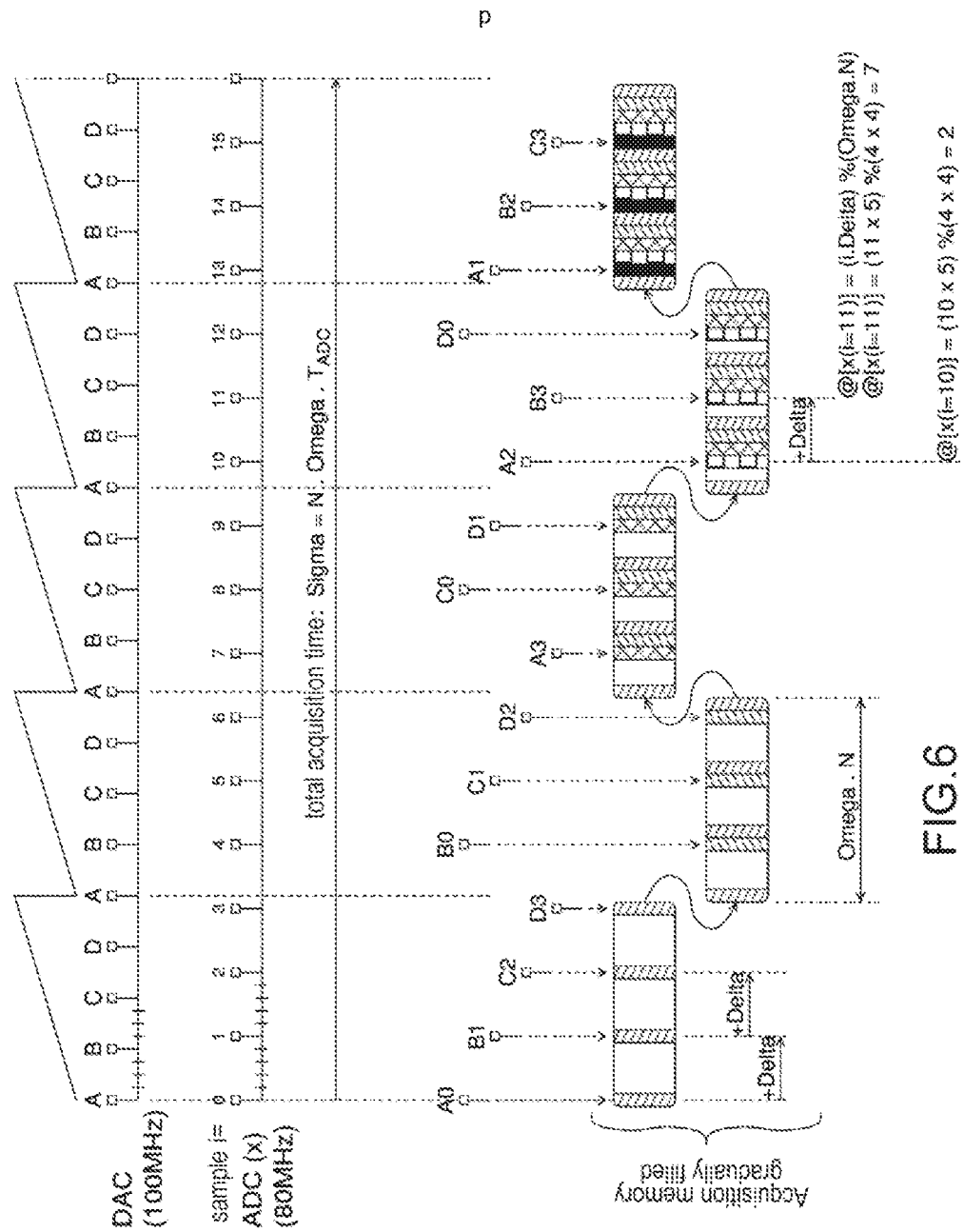

METHOD AND DEVICE FOR DETECTING FAULTS IN A TRANSMISSION LINE

CROSS-REFERENCE TO RELATED APPLICATIONS

This application is a National Stage of International patent application PCT/EP2018/064414, filed on Jun. 1, 2018, which claims priority to foreign French patent application No. FR 1755478, filed on Jun. 16, 2017, the disclosures of which are incorporated by reference in their entirety.

FIELD OF THE INVENTION

The invention relates to the field of systems for diagnosing wires based on the principle of reflectometry. One subject of the invention is in particular a method for detecting faults in a transmission line, such as a cable.

BACKGROUND

Cables for supplying power or transmitting information are ubiquitous in all electrical systems. These cables are subject to the same stresses as the systems that they connect and may be subject to failures. It is therefore necessary to be able to analyze their state and to obtain information on not only whether or not there are any faults but also on their location and their type, in order to assist with maintenance. Conventional reflectometry methods allow this type of tests.

Reflectometry methods use a principle similar to that of radar: an electrical signal, the probe signal or reference signal, which is most often of high frequency or wideband, is injected into the cable to be tested in one or more places. The signal propagates through the cable or the network of cables and some of its energy is reflected when it encounters an electrical discontinuity. An electrical discontinuity may result, for example, from a connection, from the end of the cable or from a fault or more generally from a break in the conditions of propagation of the signal through the cable. Such a break most often results from a fault that modifies the characteristic impedance of the cable locally, thereby generating a discontinuity in its parameters per unit length.

The invention relates to the field of application of methods for diagnosing wires and is applicable to any type of electrical cable, in particular power transmission cables or communication cables, in fixed or mobile installations. The cable in question may be a coaxial cable, a twin-lead cable, a parallel-line cable, a twisted-pair cable or any other type of cable provided that it is possible to inject into the cable at some point a reflectometry signal and to measure its reflection at the same point or at another point.

Analysis of the signals returned to the point of injection allows information on the presence and location of discontinuities, and therefore of potential faults, to be deduced therefrom. The analysis is conventionally carried out either in the time domain or in the frequency domain. These methods are referred to by the acronyms TDR (for time domain reflectometry) and FDR (for frequency domain reflectometry).

The precision of the detection of faults with diagnosing systems based on analysis of electrical signals by reflectometry depends on the duration of the injected signal and on the sampling rate of the measuring system. In order to be able to detect faults with a high precision, it is necessary to use a high-frequency emission signal to ensure the wavelength of the injected signal coincides with the physical dimensions of the faults in the cable.

One known method allowing the precision of the detection of faults to be increased consists in increasing the amount of necessary hardware, in order to make multiple acquisitions of the signal back-propagated through the cable while shifting, for each successive acquisition, the phase of the sampling clock. This method yields pertinent results provided that the signal injected into the cable and measured during the successive acquisitions is stationary throughout the duration of the acquisition. One major drawback of this method is that it requires a very long acquisition time and data processing that is complex. This time is determined by the number of successive phase shifts but also by the phase-shift time specific to the circuits used to generate the clock signals of the digital sampling systems. However, this delay may be unacceptable when it is a question of detecting intermittent faults (a short-circuit for example) the duration of which is short. Moreover, the means required to implement this method, and in particular to generate the phase shifts of the clock signal, are expensive. Furthermore, the precision of the measurements must meet over-sampling rules, and this method requires resource-intensive post-processing of the data to be carried out to recompose the over-sampled signal. This constraint is all the more complex to meet when analogue components are used to generate the delays, these analogue components being components such as delay-locked loops (DLL), which are moreover liable to introduce parasitic frequencies, but also converters or filters.

Another thing to be taken into consideration is that a system for detecting faults by reflectometry comprises at least one digital-analogue conversion (DAC) of the signal to be injected and one analogue-digital conversion (ADC) of the signal to be measured. However, very-high-performance analogue-digital converters able to inject and measure a high-frequency sampling signal remain expensive. They are therefore unsuitable for low-cost systems or for methods such as the aforementioned consisting in increasing the number of components.

There is thus a need for a suitable solution that mitigates the drawbacks of known solutions. The present invention meets this need.

SUMMARY OF THE INVENTION

One subject of the present invention relates to a method and device for detecting faults in a transmission line, based on analysis by reflectometry, that allow an over-sampled signal to be simply and effectively recomposed.

Advantageously, the method of the invention is a method for directly processing information output from an analogue-digital converter of a reflectometry analyzing system, that allows a stationary signal to be analyzed without post-processing being required to recompose it.

Advantageously, the device of the invention allows the DAC and ADC converters to operate asynchronously.

The present invention is advantageously applicable to on-board electronic systems in which, miniaturization being a challenge, it is recommendable to limit the number of components and power consumption in order to increase the operating lifetime of devices. Thus, the present invention has the advantage of providing a low-cost solution while increasing the precision of the measurements, and is in particular applicable to the detection of intermittent faults (of short duration), something that current applications are unable to do because of their narrow bandwidth.

Advantageously, the present invention allows the precision of detection to be increased, and thus intermittent faults that are not detectable with existing systems to be observed.

Thus, the invention provides, without additional hardware cost, a solution allowing:
- an under- or over-sampled signal to be simply and effectively recomposed without post-processing;
- the throughput of digital communications to be increased via the faster synchronization and longer acquisition times enabled;
- a stationary signal to be reconstructed when the DAC and ADC converters operate asynchronously;
- the parasitic frequencies that existed in known systems due to delay- or frequency-generating circuits to be eliminated.

To obtain the sought-after results, a method for detecting faults in a transmission line by reflectometry is proposed, said method comprising the following steps:
- injecting into the transmission line a reference signal at an emission frequency $f_{DAC}$; collecting a reflected signal at a point on the transmission line;
- sampling the reflected signal at a sampling frequency $f_{ADC}$, the sampling frequency $f_{ADC}$ being different from the emission frequency $f_{DAC}$;
- storing each point of the sampled signal at a memory address corresponding to an index assigned to said point of the sampled signal and according to a precomputed address increment $\Delta$, said memory-address increment $\Delta$ depending on the emission frequency $f_{DAC}$, on the sampling frequency $f_{ADC}$, on an over-sampling factor $\Omega$ and on a preset acquisition time $\Sigma$;
- repeating the storing step during the preset acquisition time $\Sigma$; and
- generating, from the points stored during the acquisition time, a recomposed signal able to be used to detect faults.

According to various embodiments:
- the sampling step comprises a step consisting in indexing each point of the sampled signal with an index related to the index of the preceding point of the sampled signal and to the precomputed value of the memory-address increment $\Delta$;
- the method comprises an initial step of computing the memory-address increment $\Delta$;
- the memory-address increment $\Delta$ is computed from a predefined value of the emission frequency $f_{DAC}$ and from a predefined value of the over-sampling factor $\Omega$, and wherein the sampling frequency $f_{ADC}$ and the acquisition time $\Sigma$, are determined depending on predefined values of the emission frequency $f_{DAC}$ and of the over-sampling factor $\Omega$;
- the memory-address increment $\Delta$ is computed from a predefined value of the emission frequency $f_{DAC}$ and from a predefined value of the sampling frequency $f_{ADC}$, and wherein the over-sampling factor c and the acquisition time $\Sigma$ are determined depending on the predefined values of the emission frequency $f_{DAC}$ and of the sampling frequency $f_{ADC}$;
- the step of generating a recomposed signal consists in reading the points of the sampled signal stored at the predetermined addresses;
- the method comprises a step of producing a reflectogram;
- the method comprises a step of analyzing the reflectogram with a view to detecting faults.

Another subject of the invention is a system for detecting faults in a transmission line by reflectometry that comprises means for implementing the claimed method.

According to one particular variant, the system according to the invention comprises a display interface for displaying information characteristic of the presence of a fault on the transmission line and/or of the location of the fault.

Yet another subject of the invention is a computer program containing instructions for executing the method for detecting a fault in a transmission line according to the invention, when the program is executed by a processor and a processor-readable storage medium on which is stored a program containing instructions for executing the method for detecting a fault in a transmission line according to the invention, when the program is executed by a processor.

BRIEF DESCRIPTION OF THE DRAWINGS

Other features and advantages of the present invention will become more clearly apparent on reading the following description with reference to the appended drawings; which show:

FIG. 6, a temporal view of the direct recomposition of an over-sampled signal according to the method of the invention.

DETAILED DESCRIPTION

Figure 1:
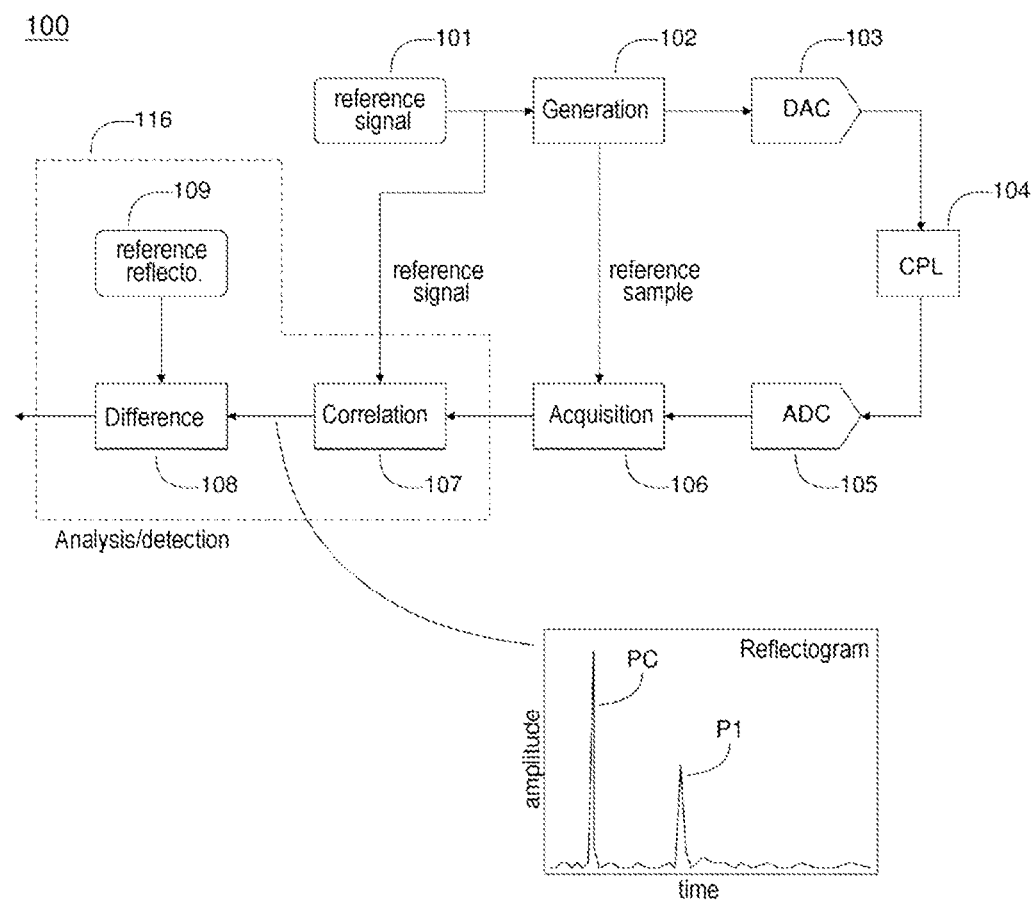
FIG. 1, a schematic of a prior-art system for detecting faults in a transmission line using a method for analyzing by reflectometry.

FIG. 1 schematically shows a known prior-art system 100 for detecting faults in a transmission line, according to the principle of analysis by reflectometry. The system 100 mainly comprises an emitting portion consisting of a generator 102 for generating a reference or test signal, based on parameters 101 of the signal. The reference signal may be time-domain or frequency-domain. It may be a question of a simple time-domain pulse or of a more elaborate signal, provided that the latter has good autocorrelation properties, i.e. that the result of an autocorrelation computation applied to this signal gives a significant amplitude peak that it is possible to identify and to detect. For example, the signal used may be an OMTDR (orthogonal multitone time-domain reflectometry) or MOTOR (multicarrier time-domain reflectometry) signal. The signal is sent to a digital-analogue converter (DAC) 103 that allows the digital reference signal to be converted into an analogue signal that is then injected at a point on the transmission line (not shown in FIG. 1, referenced L in FIG. 2) via a coupler 104. The system 100 then comprises a receiving portion that comprises a coupler 104 (which may or may not be the same as the preceding coupler) in order to collect, at a point on the line, the reflected signal back-propagated through the transmission line. The collected signal is digitally converted via an analogue-digital converter (ADC) 105, which sends it to a raw-signal-acquiring and post-processing circuit 106. A certain number of acquisitions of points of the reflected signal are made according to a temporal reference given by a reference sample, before the signal is reformed by post-processing.

The recomposed signal may then be analyzed (block 116) in order to detect any faults. Optionally, a correlator 170 may be tasked with making a correlation between the recomposed signal output from the post-processing block 106 and the reference signal, for various time shifts, in order to produce a time-domain reflectogram. It will be noted that for simple TDR (time-domain reflectometry) systems, a correlator is not required.

An example of a time-domain reflectogram is shown at the bottom of FIG. 1. It contains a certain number of amplitude peaks that result from impedance discontinuities in the transmission line. The temporal abscissae of the peaks in the reflectogram correspond to positions in the transmission line. The conversion relationship between a temporal abscissa t and position d is given by the relationship d=V·t, where V is the propagation speed of the signal in the line. The obtained reflectogram may be compared 108 by computing its difference with respect to a reference reflectogram 109 in order to detect potential errors in the channel. In the reflectogram given by way of example in FIG. 1, a first peak Pc that corresponds to the point of injection of the signal then a second peak $P_1$ that corresponds to an impedance discontinuity, which may be due to an electrical fault on the line, may be seen. Thus, by analyzing the reflectogram, it is possible to deduce whether or not faults are present in a transmission line and their location.

Figure 2A:
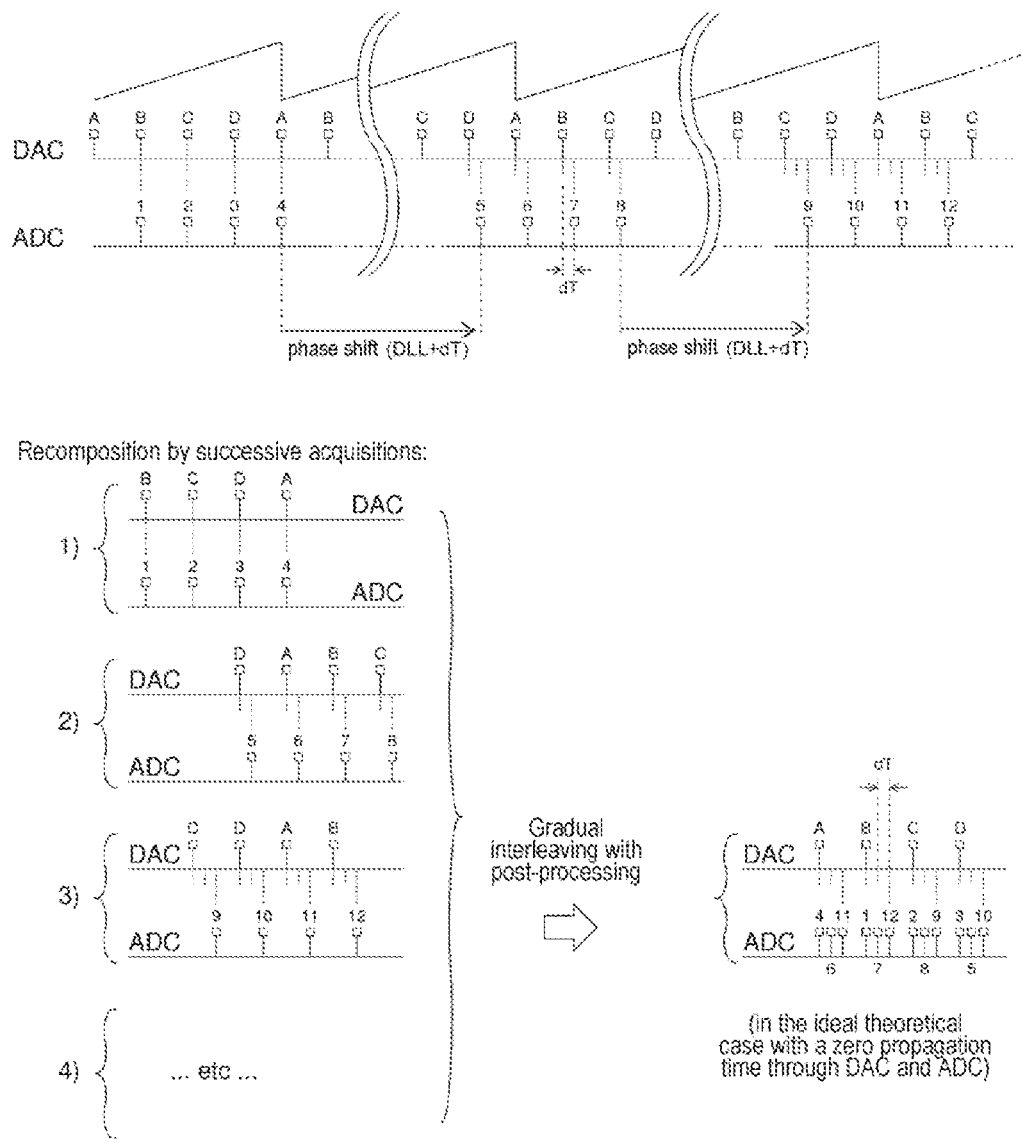
FIG. 2a, a temporal view of the recomposition of an over-sampled signal by a system for detecting faults according to FIG. 2b.

As illustrated in FIG. 2a, to detect intermittent faults, i.e. faults that have a time-limited existence, in general of short duration, the reference signal used is a stationary signal 5, or more correctly a signal in the steady-state regime, which is injected continuously into the cable L. The stationary signal is, for example, composed of a sequence (A, B, C, D) of samples having a preset duration, this sequence being successively reinjected periodically T. Simultaneously to the injection of the signal, the signal back propagated through the cable is continuously measured. To improve the precision of the analysis, the reflected signal is over-sampled by shifting the phase of the sampling clock of the analogue-digital converter every period T or multiple of this period T. The acquisition of the received samples (1, 2, 3, 4, etc.) over a certain number of periods allows the signal to be recomposed then, subsequently, processing to be carried out with the reference signal in order to detect faults.

The example of FIG. 2a shows the injection and sampling of a stationary signal with two identical frequencies for the DAC and ADC. The shift of the phase of the sampling time of the ADC allows sampling at intermediate times to be simulated. As explained above, there is no known or coherent nor indeed really anticipatory method for sensibly reordering without post-processing the elements output from the ADC in so far as the phase-shifting time is not known in advance, but is solely guaranteed to lie between upper and lower limits. The reason is essentially that an unpredictable delay is inserted between two successive acquisitions, said delay being due to the locking time of the DLL and to the propagation time of the signals through all of the components.

Figure 2B:
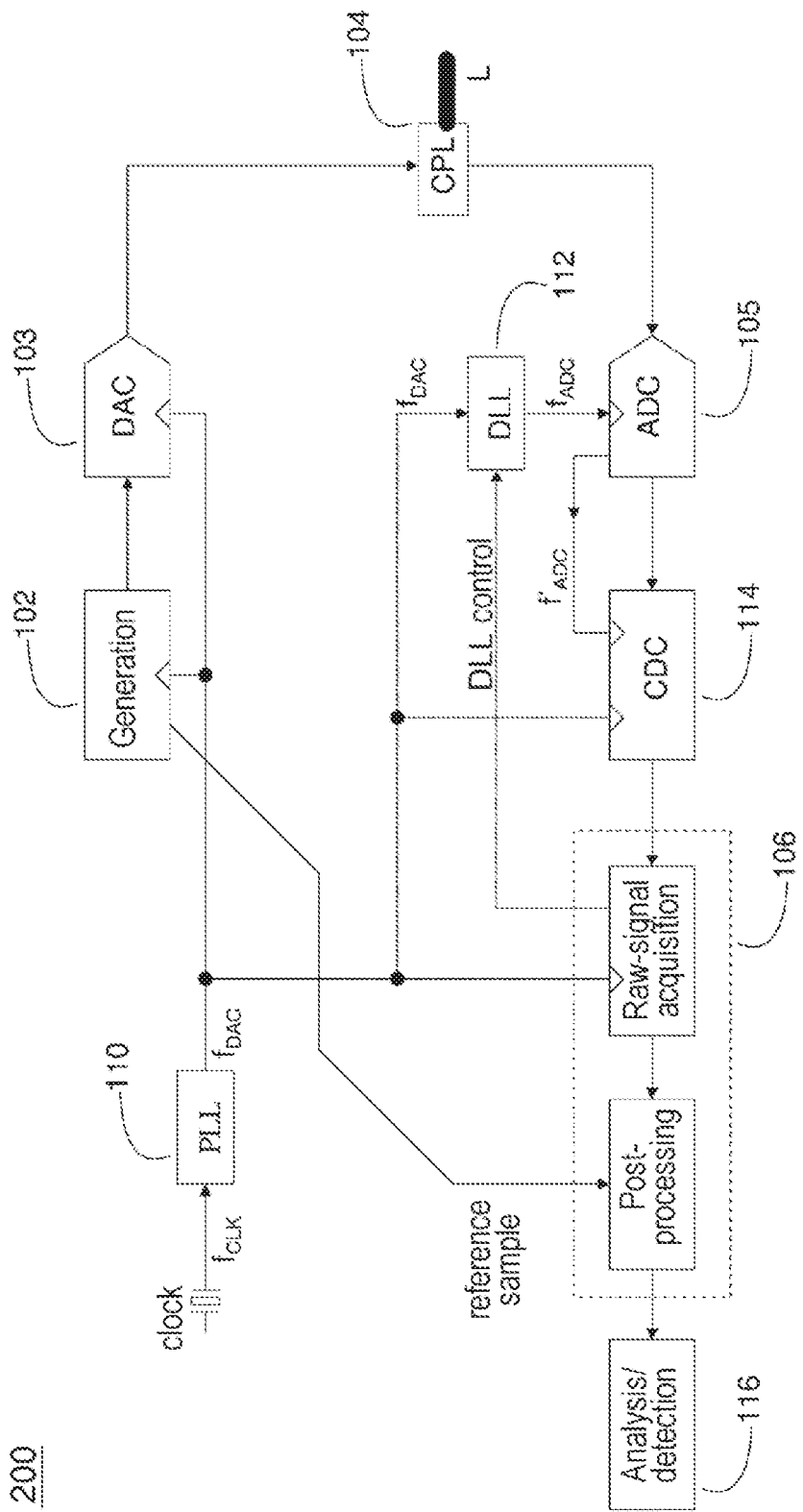

FIG. 2b illustrates a known implementation of a circuit allowing a stationary signal to be recomposed after phase-shifting, by a DLL 112, of the sampling time of the analogue-digital converter (ADC) with respect to that of the digital-analogue converter (DAC). It will be noted that components that are the same have been given the same references in all the figures. Without going into the detail of the implementation of the management of the clocks, those skilled in the art will understand that the circuit may operate based on a system clock frequency $f_{CLK}$ allowing, via a PLL 110, a clock frequency to be generated in order to synchronize the various components of the system. The sampling time of the ADC may be phase-shifted based on the sampling frequency $f_{DAC}$ of the DAC, using a DLL 112. In operation, and as known per se, the reflected signal is sampled at the output of the ADC at the frequency $f_{ADC}$. A number of samples is counted before being used in post-processing to reconstruct the reflected signal, which will be analyzed in an analyzing and detecting circuit 116. One drawback of known implementations is that the raw-signal-acquiring and post-processing circuit 106 is very complex, since it must inter alia manage all the phase-shift parameters of the DLL (or of any equivalent circuit for managing time delay). In the illustrated example, the clocks f_DAC and f_ADC of the converters are generated by one and the same generator (typically a PLL 110) in order to limit variations in the time and frequency drifts. The raw-signal-acquiring and post-processing block 106 must re-synchronize all the samples with respect to a reference sample and put them in order. The post-processing also consists in realigning the samples in a given period of the DAC, because of a delay effect, which is intrinsic to any analog processing chain or to any change of domain (CDC 114), this problem being well known to those skilled in the art. In addition, the post-processing block must manage the number of samples gained or lost, depending on the direction of the phase-shift, which, after "2pi", is intrinsically shifted by plus or minus one generation sample (DAC), depending on the type of DLL used. To achieve greater flexibility, the post-processing may be carried out by a specific piece of software. However, the post-processing time is long, and in addition unusable in an on-board system with no processor, or indeed with a processor of average performance, this in general being the case in on-board systems.

Thus, advantageously, contrary to the prior art, the device of the invention does not employ a clock-delaying system, nor a servo-control loop, nor overall control, nor a complex recomposition or address-assignment mechanism after the ADC to deinterlace the data.

The novel and inventive principle of the invention consists in using different frequencies $f_{DAC}$ and $f_{ADC}$ for the clock signals driving the DAC and ADC converters, contrary to the prior art in which the frequencies $f_{DAC}$ and $f_{ADC}$ are the same but in which the clock signals driving the DAC and ADC converters are phase-shifted.

By virtue of a precomputed indexation, each sampled point is indexed and stored at a memory address that is assigned thereto depending on its index, allowing the required signal to be directly collected for the analysis, without post-processing to recompose it being required.

Figure 3:
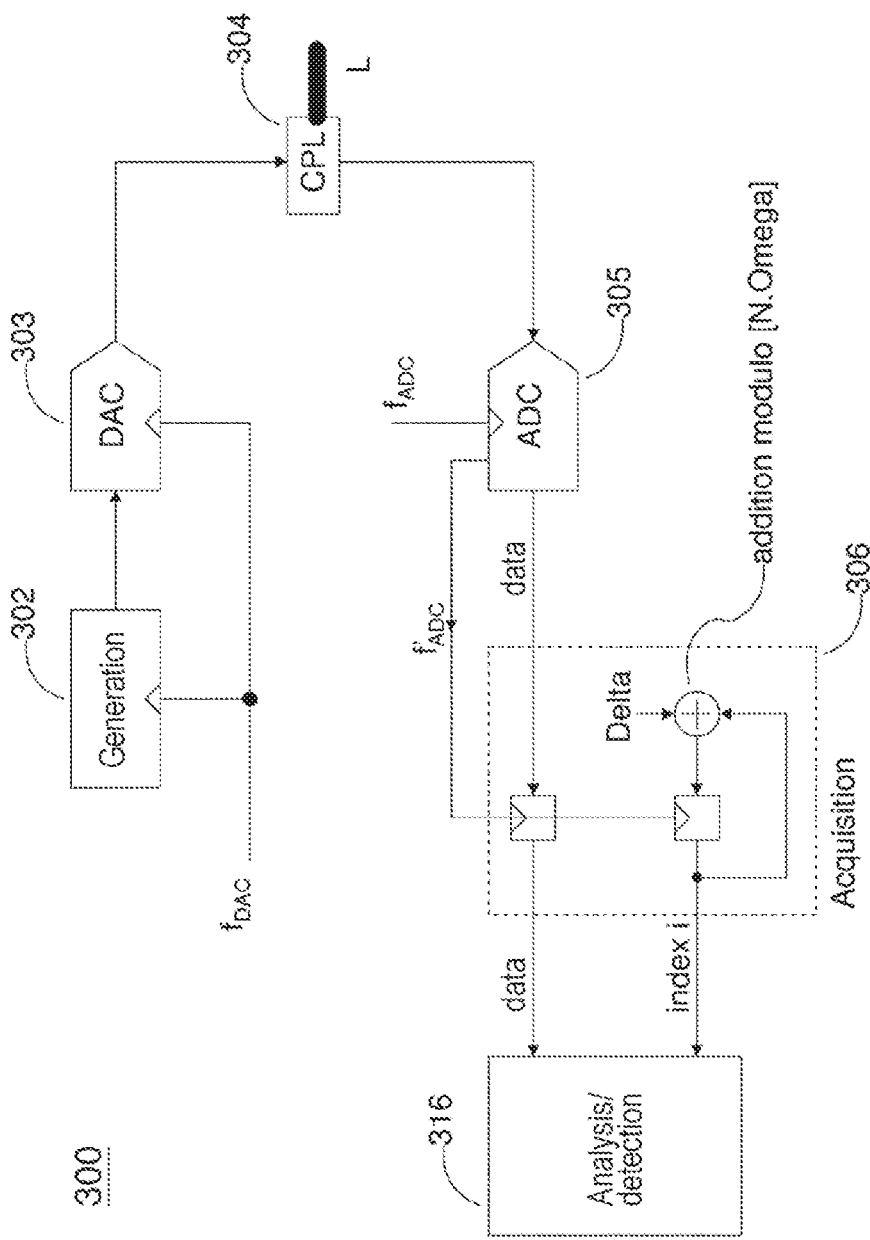
FIG. 3, a schematic of one embodiment of the device for detecting faults in a transmission line of the invention.

FIG. 3 illustrates one embodiment of the device of the invention. The system 300 comprises an emitting portion (302, 303, 304) and a receiving portion (304, 305, 306). An analyzing and fault-detecting block 316, details of which will not be given because it is able to implement conventional techniques, may be directly coupled to the device of the invention.

The emitting portion consists of a generator 302 able to generate a reference (or test) signal that is sent to a digital-analogue converter 303 that operates at a frequency $f_{DAC}$. The signal is injected into a transmission line L via a coupler 304. The receiving portion consists of a coupler 304 (which may or may not be the same as the emission coupler) in order to collect the back-propagated signal, which is converted in an analogue-digital converter 305 with a view to sampling the signal at a frequency $f_{ADC}$. In one variant embodiment, the frequency of the DAC and the frequency of the ADC may be obtained from the frequency of the system clock via one or more PLL.

Figure 4:
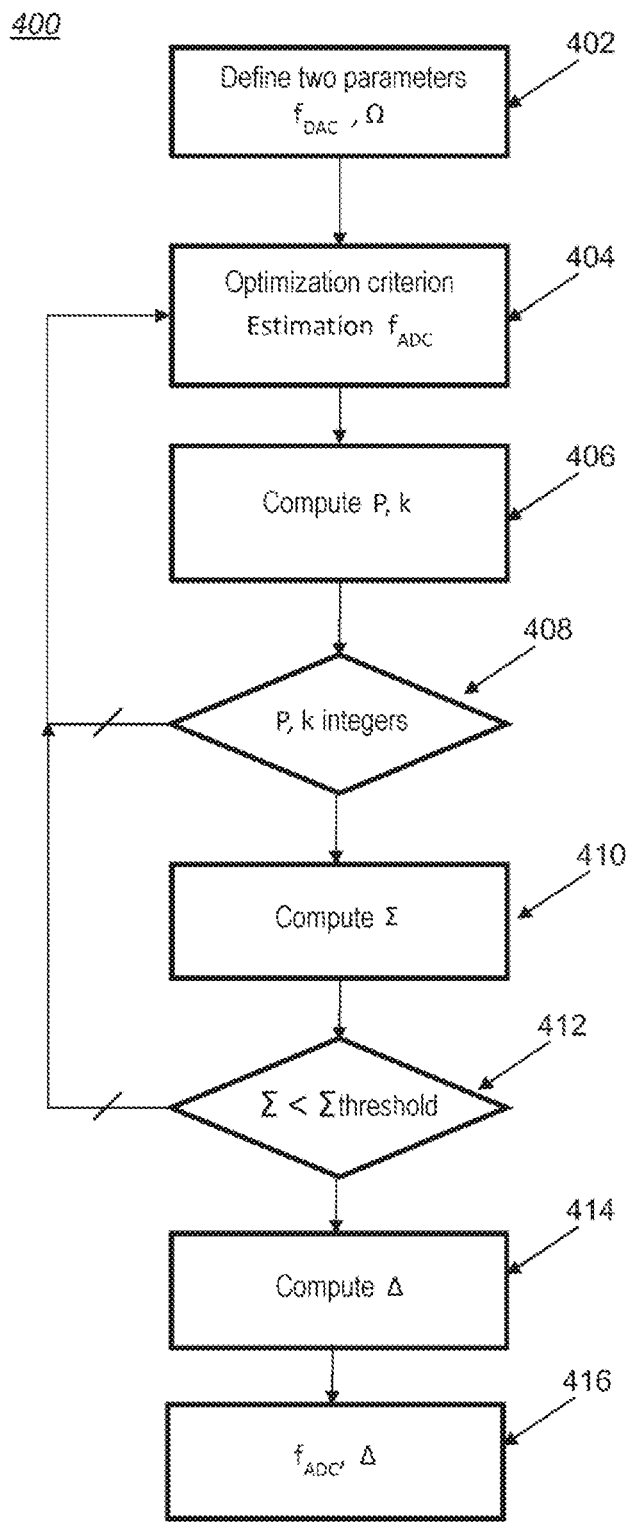
FIG. 4, a flowchart showing steps of the computation of the increment of storage of the samples according to one embodiment of the invention.

The receiving portion of the device of the invention in addition comprises an acquiring block 306 able to generate, for each sample (or point of the back-propagated signal), a memory address at which to store it. Advantageously, according to the principle of the invention and as illustrated in FIG. 4, a memory-address increment is computed beforehand, i.e. precomputed, so as to directly obtain a recomposed signal, without post-processing after the acquisition of the samples.

Advantageously, and contrary to known prior-art methods, the acquiring block 306 of the device of the invention performs no complex computations or post-processing to put all the samples in the right order and generate a recomposed signal.

In one embodiment, the acquiring block comprises an adder in order to assign, to each acquired sample, a respective index corresponding to a memory address at which to store it. In operation, each sample x(t) output from the ADC converter is labelled ($x_i$), with an index i that is the index of the preceding sample plus the value of the pre-computed increment ($\Delta$) modulo N·$\Omega$, N being the number of points from which the stationary signal injected by the DAC is composed and Omega ($\Omega$) the over-sampling factor.

For example, for a sample x(t) acquired at the time (t) labelled with the index i, the following sample acquired at the time (t+$T_{ADC}$) ($T_{ADC}$ being the acquisition period) will be labelled with the index (i+Delta)modulo N·Omega:

$$x(t) \rightarrow x_i$$

$$x(t+T_{ADC}) \rightarrow x_{(i+\Delta) \bmod N\Omega},$$

The samples are acquired during a predefined acquisition time and are stored at addresses corresponding to the respective indices, according to the precomputed address increment.

The signal available at the output of the acquiring block is directly recomposed may be used for any analysis by reflectogram in a conventional way.

FIG. 4 shows the steps 400 for determining the increment Delta according to a first variant embodiment. The principle of the invention, allowing a direct recomposition of the signal, consists in determining the value of the increment Delta to be applied to the indices of the samples for the memory-address assignment. The value of Delta is dependent on a plurality of parameters: the operating frequencies $f_{DAC}$ and $f_{ADC}$ of the converters, the over-sampling factor $\Omega$, and the acquisition time $\Sigma$ required to reconstruct a signal of "Omega times N points".

Advantageously, if at least two parameters among the four are set, the proposed computation algorithm then allows the value of the increment Delta to be determined following the following reasoning:

Let P be the highest common denominator (HOD) of $T_{DAC}$ and $T_{ADC}$:

$$P = HCD(k \cdot T_{DAC}; k \cdot T_{ADC})$$

with a constant k such that $k \cdot T_{DAC}$ and $k \cdot T_{ADC}$ are integers.

P must be an integer, but it cannot be for certain values of $T_{DAC}$ and $T_{ADC}$.

Thus, when choosing $T_{DAC}$ or $T_{ADC}$, it is necessary to find $T_{ADC}$ or $T_{DAC}$ such that P and k exist and are integers, in order to obtain the correct over-sampling factor:

$$\exists k \geq 1 \in \mathbb{N} \ \& \ \exists P \in \mathbb{N} \ | P = HCD(k \cdot T_{DAC}; k \cdot T_{ADC})$$

In the described variant embodiment, in a first step 402 the frequency $f_{DAC}$ of the DAC and the over-sampling factor $\Omega$ are chosen. For example, $$f_{DAC} = \frac{1}{T_{DAC}}$$

is chosen equal to 100 MHz and $\Omega$ is chosen equal to 4.

In a following step 404, the method 400 allows a frequency $$f_{ADC} = \frac{1}{T_{ADC}}$$

to be estimated for the ADC converter. Since the solution is not unique, the method allows an optimization criterion to be selected for the two other parameters. For example, it may be decided to find the highest ADC frequency such that $f_{ADC} < f_{DAC}$. This criterion corresponds to concrete applications: since ADC are more expensive than DAC, it is in general desired to decrease their operating frequency. The optimization criterion may be completed by noting that it is desirable for the acquisition of N points to be as short as possible, i.e. by seeking to minimize $\Sigma$.

The method allows a first value to be chosen in order to estimate the frequency of the ADC. In one embodiment, it may be chosen to increase the period $T_{ADC}$ of the ADC by one "Omega-th" of the period $T_{DAC}$ of the DAC, Omega being the over-sampling factor. In the described example, the method starts with the computation of a first frequency using the following equation:

$$T_{ADC} = T_{DAC} \cdot \frac{\Omega+1}{\Omega} = 10 \cdot \frac{5}{4} = 12.5 \text{ ns},$$

giving a first frequency for the ADC of: $f_{ADC}$=80 MHz.

A person skilled in the art could choose to use another starting point to set a first value of the frequency of the ADC. For instance, he could choose an arbitrary but different value for the frequency of the DAC.

The method allows, in a following step 406, the HOD to be computed such that:

$$P = HCD(k \cdot T_{DAC}; k \cdot T_{ADC}),$$

then it to be verified whether k and P are integers (step 408) respecting the equation:

$$\frac{T_{DAC}}{\Omega} = \frac{P}{k}.$$

In the chosen example: P=HCD(k·10; k·12.5). The ratio $$\frac{T_{DAC}}{\Omega}$$

with k and P integers is verified for:
k=2 and
P=HCD(20; 25)=5.

Those skilled in the art will be able to think of various known methods that could be used to compute the HOD, such as for example successive divisions (Euclidean division).

If integer values are not found for k and P, the method returns to step 404 in order to set a new value for the frequency of the ADC and to repeat steps 406 to 408 until integers are obtained.

Next, the process continues with the following step 410, in which the total sample acquisition time Σ required to reconstruct a signal of N points is estimated.

The acquisition time is given by the equation: $\Sigma = N \cdot \Omega \cdot T_{ADC}$. In the chosen example:

$$\Sigma = N \cdot 4 \cdot T_{ADC} = N \cdot 4 \cdot 12.5 \text{ ns} = 50 \cdot N \text{ ns}.$$

The method allows the acquisition time to be compared to a threshold value (step 412). The threshold value may be predefined and set, or tailored to the application. If the obtained acquisition time is above the threshold and therefore long, the method returns to step 404 in order to reconsider other ADC frequencies.

If the acquisition time is below the threshold, the method continues with the following step 414, in which the value of the increment Delta is computed so that:

$$\Delta = k \cdot \frac{T_{ADC}}{P}.$$

In the chosen example, the increment in the indices for the memory-address assignment would be Δ=5.

The method ends (step 414) once the values of the frequencies of the DAC and ADC and the value of the increment used storing the samples in memory, so as to obtain a recomposed signal directly without needing to carry out post-processing, have been determined.

The table below shows various examples of sampling frequencies for the DAC and ADC converters, and the corresponding values of the memory-address increment Δ.

| $f_{DAC}$ (MHz) | $T_{DAC}$ (ns) | $f_{ADC}$ (MHz) | $T_{ADC}$ (ns) | P, k | δ (ns) | Δ | Ω |
|---|---|---|---|---|---|---|---|
| 50.0 | 20.0 | 40.0 | 25.0 | 5, 1 | 5 | 5 | 4 |
| 100.0 | 10.0 | 40.0 | 25.0 | 5, 1 | 15 | 5 | 2 |
| 100.0 | 10.0 | 33.333 | 30.0 | 10, 1 | 20 | 3 | 1 |
| 100.0 | 10.0 | 80.0 | 12.5 | 5, 2 | 2.5 | 5 | 4 |
| 66.667 | 15.0 | 62.745 | 15.937 | 15, 16 | 0.937 | 17 | 16 |

Even though FIG. 4 illustrates a variant embodiment for determining the address increment in which the two initially set parameters are the frequency $f_{DAC}$ of the DAC and the over-sampling factor Ω, the method may be implemented equivalently using, as set parameters, the frequency $f_{DAC}$ of the DAC and the frequency $f_{ADC}$ of the ADC. By estimating the values of the over-sampling factor and of the acquisition time relative to the values of P and k, the value of the memory increment is computed.

Figure 5:
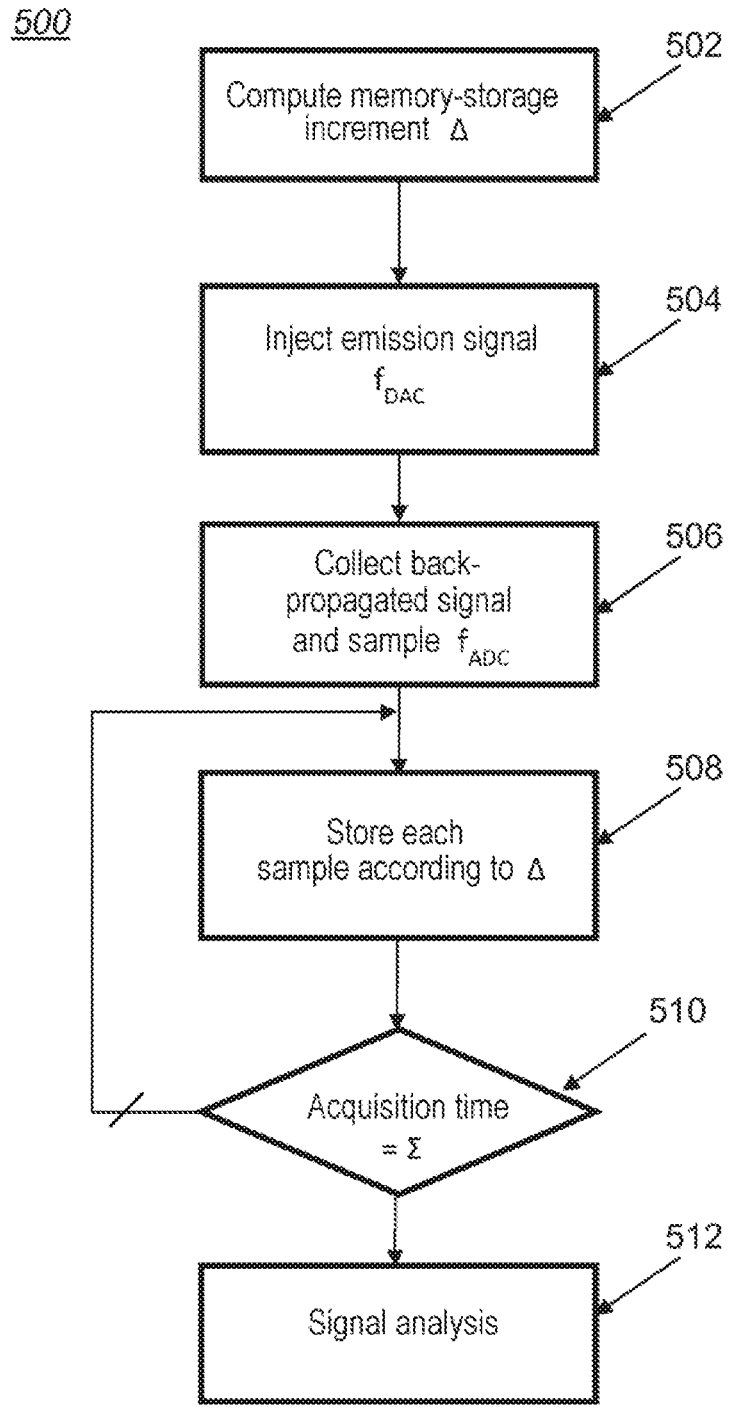
FIG. 5, a flowchart showing steps of the method for detecting faults according to one embodiment of the invention.

FIG. 5 summarizes the steps of the method 500 implemented to detect a fault according to the invention. The method may be carried out using a device such as that in FIG. 3.

In a first step 502, the method determines the value of the increment Delta using the algorithm described with reference to FIG. 4. It will be noted that this step may be carried out independently of the test of a line and that the method then employs parameters computed beforehand.

In a following step 504, an emission signal is injected at an injection point on a transmission line L at the frequency $f_{DAC}$ of the digital-analogue converter. In a following step 506, the signal back-propagated through the line L is collected and sampled at the frequency of the analogue-digital converter $f_{ADC}$.

In the following step 508, the method allows each sample (or point of the signal) to be stored at an address, taking into account the value of the increment that was computed. FIG. 6 illustrates a temporal view of the direct recomposition of an over-sampled signal according to the method of the invention, for the chosen example of a frequency of the DAC of 100 MHz, a frequency of the ADC of 80 MHz and an address increment Δ of 5.

The method determines when the acquisition time is reached (step 510), in order to continue with the analysis of the signal (step 512).

In a subsequent step (not illustrated) a diagnosis may be carried out as to the presence of a fault and to its position measured in the reflectogram R(t). The result of the diagnosis may be delivered to a user via a display interface. The displayed result may comprise an indication of the presence of a fault on the line and/or an indication as to the position of the fault on the line.

The system according to any one of the variant implementations of the invention may be implemented by an electronic board on which the various components are arranged. The board may be connected to the cable to be analyzed by way of a coupling means CPL, which may be a capacitive or inductive directional coupler or else a resistive connection. The coupling device may be formed by physical connectors that link the signal generator to the cable or by contactless means, for example a metal cylinder the inside diameter of which is substantially equal to the outside diameter of the cable and that couples capacitively to the cable.

Furthermore, a processing unit, such as a computer, personal digital assistant or other equivalent electronic or computing device, may be used to drive the system according to the invention and display the results of the computations on a human-machine interface, and in particular information on the detection and location of faults in the cable.

The method according to the invention may be implemented in a processor, which may optionally be an on-board processor, or in a specific device. The processor may be a generic processor, a specific processor, an application-specific integrated circuit (ASIC) or a field—programmable gate array (FPGA). The device according to the invention may use one or more dedicated electronic circuits or a general-use circuit. The technique of the invention may be carried on a reprogrammable computing machine (a processor or a microcontroller for example) that executes a program containing a sequence of instructions, or on a dedicated computing machine (for example a set of logic gates such as an FPGA or an ASIC, or any other hardware module).

The method according to the invention may also be implemented exclusively as a computer program, the method then being applied to a signal measurement acquired beforehand using a measuring device. In such a case, the invention may be implemented as a computer program containing instructions for the execution thereof. The computer program may be stored on a storage medium that is readable by a processor.

The reference to a computer program that, when it is executed, performs any one of the previously described functions is not limited to an application program running on a single host computer. On the contrary, the terms computer program and software are used here in a general sense to refer to any type of computer code (for example, application software, firmware, microcode, or any other form of computer instruction) that may be used to program one or more processors so as to implement aspects of the techniques described here. The computing means or resources may notably be distributed (cloud computing), possibly using peer-to-peer technologies. The software code may be executed on any suitable processor (for example a microprocessor) or processor core or a set of processors, whether they are provided in a single computing device or distributed between several computing devices (for example such as possibly accessible in the environment of the device). The executable code of each program allowing the programmable device to implement the processes according to the invention may be stored for example in the hard disk or in read-only memory. Generally speaking, the program or programs may be loaded into one of the storage means of the device before being executed. The central unit is able to command and direct the execution of the instructions or software code portions of the program or programs according to the invention, which instructions are stored in the hard disk or in the read-only memory or else in the other abovementioned storage elements.

The invention claimed is:

1. A method for detecting faults in a transmission line (L) by reflectometry, comprising the steps of:
    injecting into the transmission line a reference signal at an emission frequency $f_{DAC}$;
    collecting a reflected signal at a point on the transmission line;
    sampling the reflected signal at a sampling frequency $f_{ADC}$, the sampling frequency $f_{ADC}$ being different from the emission frequency $f_{DAC}$;
    storing each point of the sampled signal at a memory address corresponding to an index assigned to said point of the sampled signal and according to a precomputed memory-address increment $\Delta$, said memory-address increment $\Delta$ depending on the emission frequency $f_{DAC}$, on the sampling frequency $f_{ADC}$, on an over-sampling factor $\Omega$ and on a preset acquisition time $\Sigma$;
    repeating the storing step during the acquisition time $\Sigma$; and
    generating, from the points stored during the acquisition time, a recomposed signal able to be used to detect faults.

2. The method as claimed in claim 1, wherein the sampling step comprises a step consisting in indexing each point of the sampled signal with an index related to the index of the preceding point of the sampled signal and to the precomputed value of the memory-address increment $\Delta$.

3. The method as claimed in claim 1 or 2, comprising an initial step of computing the memory-address increment $\Delta$.

4. The method as claimed in claim 3, wherein the memory-address increment $\Delta$ is computed from a predefined value of the emission frequency $f_{DAC}$ and from a predefined value of the over-sampling factor $\Omega$, and wherein the sampling frequency $f_{ADC}$ and the acquisition time E are determined depending on predefined values of the emission frequency $f_{DAC}$ and of the over-sampling factor $\Omega$.

5. The method as claimed in claim 3, wherein the memory-address increment $\Delta$ is computed from a predefined value of the emission frequency $f_{DAC}$ and from a predefined value of the sampling frequency $f_{ADC}$, and wherein the over-sampling factor $\Omega$ and the acquisition time E are determined depending on the predefined values of the emission frequency $f_{DAC}$ and of the sampling frequency $f_{ADC}$.

6. The method as claimed in claim 1, wherein the step of generating a recomposed signal consists in reading the points of the sampled signal stored at the predetermined addresses.

7. The method as claimed in claim 1, in addition comprising a step of producing a reflectogram.

8. The method as claimed in claim 7, in addition comprising a step of analyzing the reflectogram with a view to detecting faults.

9. A system for detecting faults in a transmission line (L) by reflectometry, comprising means for implementing the method as claimed in claim 1.

10. The system for detecting faults as claimed in claim 9, comprising a display interface for displaying information characteristic of the presence of a fault on the transmission line and/or of the location of the fault.

11. A non-transitory computer program containing instructions for executing the method for detecting faults in a transmission line as claimed in claim 1, when the program is executed by a processor.

12. A non-transitory processor-readable storage medium on which is stored a program containing instructions for executing the method for detecting faults in a transmission line as claimed in claim 1, when the program is executed by a processor.

* * * * *

UNITED STATES PATENT AND TRADEMARK OFFICE
CERTIFICATE OF CORRECTION

PATENT NO. : 11,054,458 B2
APPLICATION NO. : 16/620853
DATED : July 6, 2021
INVENTOR(S) : Christophe Layer et al.

It is certified that error appears in the above-identified patent and that said Letters Patent is hereby corrected as shown below:

In the Claims

In Claim 5, Column 12, Line 18, "and the acquisition time E are determined" should be -- and the acquisition time $\Sigma$ are determined --.

Signed and Sealed this
Twenty-second Day of March, 2022

Drew Hirshfeld
*Performing the Functions and Duties of the
Under Secretary of Commerce for Intellectual Property and
Director of the United States Patent and Trademark Office*